United States Patent [19]

Hafner et al.

[11] 4,410,926

[45] Oct. 18, 1983

[54] ARRANGEMENT FOR GENERATING DC MAGNETIC FIELDS OF ALTERNATING POLARITY FOR THE MAGNETIC-INDUCTIVE FLOW MEASUREMENT

[75] Inventors: Peter Hafner, Therwil, Switzerland; Peter Flecken, Lorrach, Fed. Rep. of Germany

[73] Assignee: Flowtec AG, Reinach, Switzerland

[21] Appl. No.: 406,061

[22] Filed: Aug. 6, 1982

Related U.S. Application Data

[63] Continuation-in-part of Ser. No. 254,606, Apr. 16, 1981, abandoned.

[30] Foreign Application Priority Data

Oct. 2, 1980 [DE] Fed. Rep. of Germany ....... 3037305

[51] Int. Cl.³ .................. H02H 3/00; H02H 7/122
[52] U.S. Cl. ..................... 361/93; 361/101; 361/156; 363/58; 363/89
[58] Field of Search .............. 361/100, 101, 93, 156; 363/55, 56, 57, 58, 86, 89; 318/341

[56] References Cited

U.S. PATENT DOCUMENTS 3,284,692  11/1966  Gautherin ..................... 363/89 X
3,733,538  5/1973  Kernick et al. .................. 363/58
3,893,006  7/1975  Algeri et al. .................. 363/56 X

FOREIGN PATENT DOCUMENTS 2744845  4/1979  Fed. Rep. of Germany ...... 361/101

*Primary Examiner*—Reinhard J. Eisenzopf
*Attorney, Agent, or Firm*—Gerald J. Ferguson, Jr.; Joseph J. Baker; C. Lamont Whitham

[57] ABSTRACT

An arrangement for generating DC magnetic fields of alternating polarity for the magnetic-inductive flow measurement by means of a field coil which is connected via alternately controlled switching members to a DC voltage source, wherein during the reversal time following the change-over of the switching members a capacitor is connected to the field coil to form a resonant circuit separate from the DC voltage source and the capacitance C of the capacitor in dependence upon the desired reversal time $\Delta t$ has substantially the value $$C = \frac{1}{L \cdot (\pi^2/\Delta t^2 + R^2/4L^2)} \text{ (Farads)}$$

wherein L is the inductance and R the ohmic resistance of the field coil.

18 Claims, 10 Drawing Figures

ARRANGEMENT FOR GENERATING DC MAGNETIC FIELDS OF ALTERNATING POLARITY FOR THE MAGNETIC-INDUCTIVE FLOW MEASUREMENT

BACKGROUND AND SUMMARY OF THE INVENTION

This application is a continuation-in-part of U.S. Ser. No. 254,606 filed Apr. 16, 1981 now abandoned.

The present invention relates to an arrangement for generating DC magnetic fields of alternating polarity for the magnetic-inductive flow measurement by means of a field coil which is connected via alternately controlled switching members to a DC voltage source.

In arrangements of this type, which are known for example from DE-AS No. 2,744,845, the problem exists that the direct current sent through the field coil cannot abruptly change its direction so that the reversal of the magnetic field requires a certain time. In magnetic-inductive flow measurement the aim is to minimize this reversal time as much as possible because it cannot be used for observing the flow.

The problem underlying the invention is the provision of an arrangement of the type mentioned at the beginning which with small additional expenditure permits the setting of a desired substantially shorter reversal time.

This problem is solved according to the invention in that during the reversal time following the change-over of the switching members a capacitor is connected to the field coil to form a resonant circuit separate from the DC voltage source and that the capacitance C of the capacitor in dependence upon the desired reversal time $\Delta t$ has substantially the value $$C = \frac{1}{L \cdot (\pi^2/\Delta t^2 + R^2/4L^2)} \text{ (Farads)}$$

wherein L is the inductance and R the ohmic resistance of the field coil.

Advantageous embodiments and further developments of the invention are characterized in the subsidiary claim.

BRIEF DESCRIPTION OF THE DRAWINGS

Further features and advantages of the invention will be apparent from the following description of examples of embodiment which are illustrated in the drawings, wherein.

DETAILED DESCRIPTION OF THE INVENTION

Figure 1:
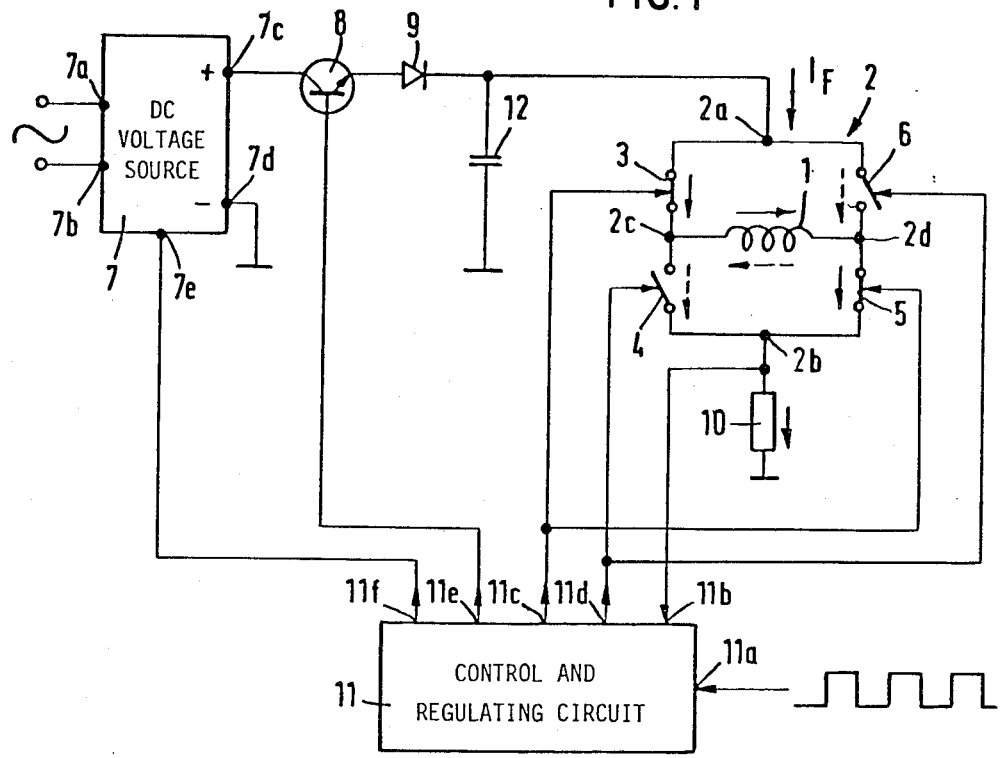
FIG. 1 shows the circuit diagram of a first embodiment of the arrangement according to the invention in a first operating state.
Figure 2:
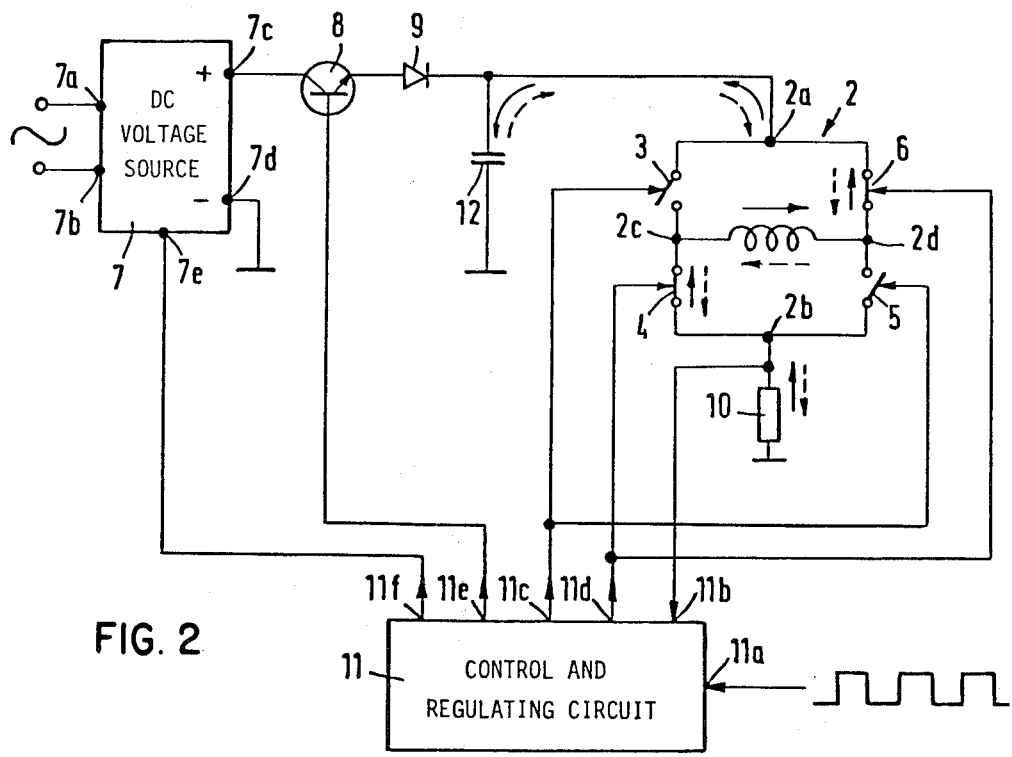
FIG. 2 shows the arrangement of FIG. 1 in a second operating state.

In the embodiment illustrated in FIGS. 1 and 2 the field coil 1 lies in the one diagonal of a bridge circuit 2 comprising four switching members 3, 4, 5, 6 which for simplification are illustrated as mechanical switches. The switching members may be relay contacts or also electronic switching members as will be explained hereinafter with reference to the examples of embodiment illustrated in FIGS. 3 and 4. Applied to the other bridge diagonal is a supply DC voltage which is furnished by a DC voltage source 7. As example it is assumed that the DC voltage source 7 is a mains network, the input terminals 7a, 7b of which receive an AC voltage and which furnishes at its output terminals 7c, 7d a rectified voltage. The mains network 7 also comprises a voltage control input 7e; by a control signal applied to said input the magnitude of the DC voltage delivered at the output 7c, 7d is defined. The output terminal 7d of the mains network 7 carrying the negative output potential is connected to ground. The output terminal 7c carrying the positive potential is connected via a current regulating transistor 8 and a diode 9 to the corner point 2a of the bridge circuit 2. The opposite bridge corner point 2b is connected via a current measuring resistance 10 to ground. The field coil 1 is connected between the two other bridge corner points 2c, 2d.

If in the circuit described above the two switches 3 and 5 lying in opposite bridge branches are closed, as illustrated in FIG. 1, whilst simultaneously the two other switches 4 and 6 are open, a direct current $I_F$ whose magnitude is defined by the current regulating transistor 8 flows from the output terminal 7c of the mains network 7 through the current regulating transistor 8 and the diode 9 to the bridge corner point 2a, from there through the closed switch 3, the field coil 1 and the closed switch 5 to the bridge corner point 2b and finally via the current measuring resistance 10 to ground. This current path is indicated in FIG. 1 by arrows which are drawn in full lines. If on the other hand the switches 4 and 6 are simultaneously closed whilst the switches 3 and 5 are open the direct current $I_F$ flows between the bridge corner points 2a and 2b via the switches 6 and 4 and in opposite direction throug the field coil 1; this is indicated in FIG. 1 by dashed arrows. If the switches 3, 5 on the one hand and the switches 4, 6 on the other are actuated in the manner outlined simultaneously in pairs in push-pull relationship direct currents are sent alternately in opposite directions through the field coil 1 so that the field coil 1 produces alternately magnetic fields of equal magnitude but opposite sign. This known coil control is also referred to as "H circuit".

The operation outlined is controlled by a control and regulating circuit 11. The latter comprises a clock input 11a at which it receives a clock signal which is formed for example by a rectangular or square voltage which assumes alternately the values 0 and 1. At a further input 11b the control and regulating circuit 11 receives the voltage across the current measuring resistance 10 which is a measurement of the current flowing through the field coil 1. An output 11c furnishes a control signal for simultaneous actuation of the switches 3 and 5 and a further output 11d furnishes a control signal for simultaneously actuating the switches 4 and 6. At an output 11e the control and regulating circuit 11 furnishes a regulating signal for adjusting the current regulating transistor 8. Finally, a further output 11f of the control and regulating circuit 11 is connected to the voltage control input 7e of the mains network 7.

The control and regulating circuit is so constructed that for the one value of the clock signal applied to its clock input 11a it furnishes at the output 11c a signal which closes the connected switches 3 and 5 whilst simultaneously furnishing at the output 11d a signal which opens the connected switches 4 and 6; for the other value of the clock signal these control signals are reversed. Thus, a push-pull actuation of the switch pairs 3, 5 and 4, 6 takes place with the rhythm defined by the clock signal. The signal received at the input 11b indicates to the control and regulating circuit 11 the magnitude of the current flowing through the field coil 1. It furnishes at the output 11c a control signal by which the value of said current is held in the stationary condition by the current regulating transistor 8 at a predetermined desired value.

Due to the inductance of the field coil 1 the current $I_F$ flowing through the field coil cannot abruptly change its direction. Thus, for each reversal operation a certain reversal time $\Delta t$ passes before the current $I_F$ has gone from its constant fixed value of the one sign to the same fixed value of the opposite sign. The objective is to keep this reversal time as short as possible.

For shortening the reversal time in the circuit illustrated in FIG. 1 a capacitor 12 dimensioned in particular manner is connected between the bridge corner point 2a and ground.

The effect of the capacitor 12 during the reversal operation will be explained with reference to FIG. 2. This figure shows the arrangement of FIG. 1 immediately after initiation of the reversal operation, i.e. after opening of the switches 3, 5 and closing of the switches 4, 6.

Prior to the opening of the switches 3, 5 (FIG. 1) the capacitor 12 was charged to a voltage which was equal to the output voltage of the mains network 7 less the voltage drops across the current regulating transistor 8 and the diode 9.

Immediately after opening of the switches 3, 5 and closing of the switches 4, 6 (FIG. 2) the field coil 1 produces a current which initially has the same direction as the current $I_F$ in the previous switch condition (FIG. 1). This current is indicated in FIG. 2 by the arrows drawn in full lines. However, it now flows from ground via the current measuring resistance 10 to the bridge corner point 2b and from the latter via the closed switch 4, the field coil 1 and the closed switch 6 to the bridge corner point 2a. The diode 9 prevents this current from being able to flow back to the mains network 7. This current must therefore be taken up by the capacitor 12 whose charge is increased so that its terminal voltage rises.

Due to the contour voltage building up at the capacitor 12 and the internal losses the current decreases. After reaching the value zero the current direction reverses so that a flow now takes place from the capacitor 12 to the bridge corner point 2a, through the switch 6, the field coil 1 and the switch 4 to the bridge corner point 2b and from there through the current measuring resistance 10 to ground; this current direction is indicated in FIG. 2 by dashed arrows. As long as the terminal voltage of the capacitor 12 is greater than the output voltage of the mains network 7 the diode 9 is blocked so that the current is furnished solely by the capacitor 12. As soon as the terminal voltage of the capacitor 12 drops to a value which is equal to the output voltage of the mains network 7 the latter again provides the current supply.

The corresponding effect results on changing to the opposite switch condition as is immediately apparent from the symmetry of the circuit.

It is thus apparent that during each reversal operation the field coil 1 is connected to the capacitor 12 to form a resonant circuit which is separated by the diode 9 from the mains network 7. If the capacitor 12 has the capacitance C and the field coil 1 an inductance L and an ohmic resistance R the resonance frequency of the resonant circuit is given by the following equation known for damped electrical resonant circuits:

$$\omega = \sqrt{\frac{1}{LC} - \frac{R^2}{4L^2}} \quad (1)$$

For a desired reversal time $\Delta t$ the capacitance C (in Farads) of the capacitor 12 is given to a first approximation by the following equation:

$$C = \frac{1}{L \cdot (\pi^2/\Delta t^2 + R^2/4L^2)} \text{ (Farads)} \quad (2)$$

Inserting the following quantities:

$U_C$: Charge voltage of the capacitor 12 prior to initiation of the reversal operation;

$U_{max}$: Maximum terminal voltage at the capacitor 12;

$U_S$: Supply DC voltage at the bridge; for the dynamic behaviour of the resonant circuit, ignoring the ohmic losses, the following relationship applies:

$$\Delta t \cong \frac{1}{\omega}\left(\pi - \arcsin\frac{U_C}{U_{max}} - \arcsin\frac{U_S}{U_{max}}\right) \text{ (sec.)} \quad (3)$$

Substantially the following maximum terminal voltage is reached at the capacitor 12:

$$U_{max} \cong \sqrt{U_C^2 + \frac{L}{C} \cdot I_F^2} \quad (4)$$

Due to the presence of the ohmic resistance in the resonant circuit on the one hand the reversal time is longer and on the other hand an energy loss occurs. In order to reach a current value of the same magnitude in the field coil after reversal the mains network must enter the operation. To achieve the advantages of the arrangement described the resonant circuit parameters must fulfil the following conditions:

$$L/R > R \cdot C \quad (5)$$

After the reversal of the field the absolute value of the coil current $I_F$ lies beneath the desired value due to the ohmic losses. A voltage increase at the output 7c of the mains network 7 accelerates reobtaining the desired value of the current $I_F$ through the field coil 1. This is the purpose of the connection illustrated in FIGS. 1 and 2 between the output 11f of the control and regulating circuit 11 and the control input 7e of the mains network 7. The control and regulating circuit 11 furnishes at the output 11f during the reversal operation a control signal which temporarily increases the output voltage of the mains network 7 until the current through the field coil 1 has reached its desired value which is indicated by the signal applied to the input 11b.

Figure 3:
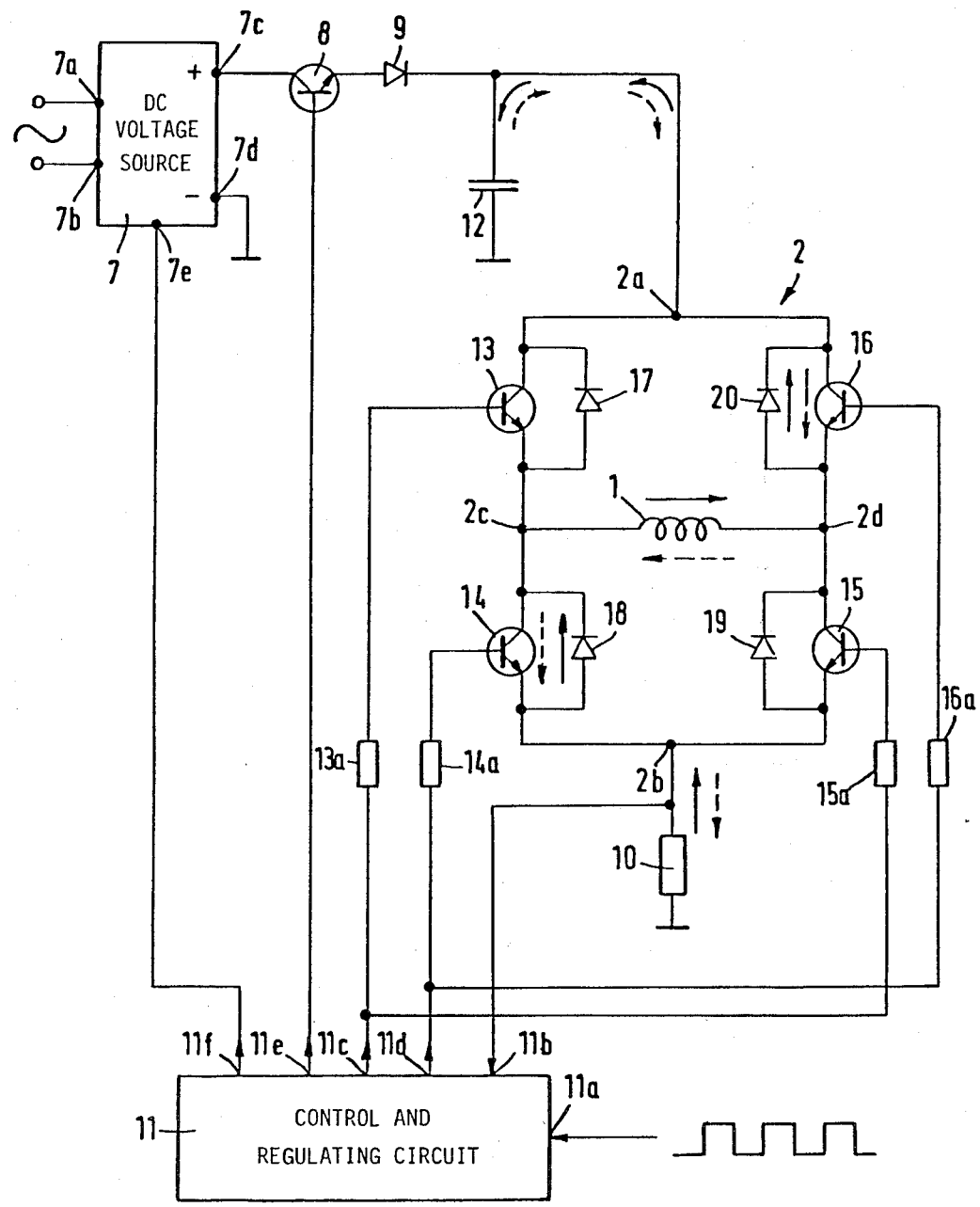
FIG. 3 shows the circuit diagram of a second embodiment of the invention.

In FIG. 3 an embodiment is illustrated which differs from the embodiment of FIGS. 1 and 2 only in that the switching members 3, 4, 5, 6 which in FIGS. 1 and 2 are represented as mechanical switches (e.g. relay contacts) are formed by transistors 13, 14, 15, 16. The collector of the transistor 13 is connected to the bridge corner point 2a and its emitter to the bridge corner point 2c. In corresponding manner the collect-emitter circuits of the transistor 14 are connected between the bridge corner points 2c, 2b, those of the transistor 15 between the bridge corner points 2d, 2b and those of the transistor 16 between the bridge corner points 2a, 2d. The bases of the transistors 13 and 15 jointly receive via base resistors 13a and 15a respectively a control signal from the output 11c of the control and regulating circuit 11 and the bases of the transistors 14 and 16 receive jointly via base resistors 14a and 16a respectively a control signal from the output 11d of the control and regulating circuit 11. Since transistors, in contrast to the mechanical switches illustrated in FIGS. 1 and 2, can transmit a current only in one direction a diode 17, 18, 19, 20 of opposite forward direction is connected in parallel with the collector-emitter path of each transistor.

The remaining components of the arrangement of FIG. 3 have the same structure and the same mode of operation as the corresponding components of the arrangement of FIGS. 1 and 2 and are designated with the same reference numerals as in the latter Figures. In particular, the capacitance of the capacitor 12 is so dimensioned in the manner previously outlined that the desired reversal time $\Delta t$ is achieved.

Assuming that the control and regulating circuit 11 furnishes at the output 11c a signal which renders the transistors 13 and 15 conductive whilst simultaneously at the output 11d a signal is emitted which renders the transistors 14 and 16 non-conductive, the arrangement of FIG. 3 has the operating condition illustrated in FIG. 1. A current then flows from the terminal 7c of the mains network 7 via the current regulating transistor 8 and the diode 9 to the bridge corner point 2a and from the latter via the conductive transistor 13 through the field coil 1 and the conductive transistor 15 to the bridge corner point 2b and from there finally via the current measuring resistance 10 to ground.

The arrows indicated in FIG. 3 correspond to the operating condition of FIG. 2, i.e. the conditions on changing from the previously outlined switch condition to the opposite switch condition, i.e. immediately after blocking of the transistors 13, 15 and opening of the transistors 14, 16.

In the initial state the field coil 1 maintains a current in the same direction as before; this current is indicated in FIG. 3 by arrows drawn in full lines. This current now flows from ground via the current measuring resistance 10 to the bridge corner point 2b and from the latter via the diode 18, the field coil 1 and the diode 20 to the bridge corner point 2a. Since due to the blocking action of the diode 9 this current cannot flow back to the mains network 7 it is taken up by the capacitor 12 whose terminal voltage rises in the manner outlined previously. When this current becomes zero the current direction reverses and the current indicated by dashed arrows now flows from the capacitor 12 to the bridge corner point 2a, from the latter through the conductive transistor 16, the field coil 1 and the conductor transistor 14 to the bridge corner point 2b and finally via the current measuring resistance 10 to ground.

These operations take place in the same manner as previously described for the mechanical switches of FIGS. 1 and 2. It is thus apparent that each of the transistors 13, 14, 15, 16 of FIG. 3 with the oppositely poled parallel-connected diode 17, 18, 19, 20 fulfils the same function as the corresponding mechanical switch of FIGS. 1 and 2. In particular, in the arrangement of FIG. 3 as well the field coil 1 is connected to the capacitor 12 during the reversal operation to form a resonant circuit which is separated by the diode 9 from the mains network 7.

Figure 4:
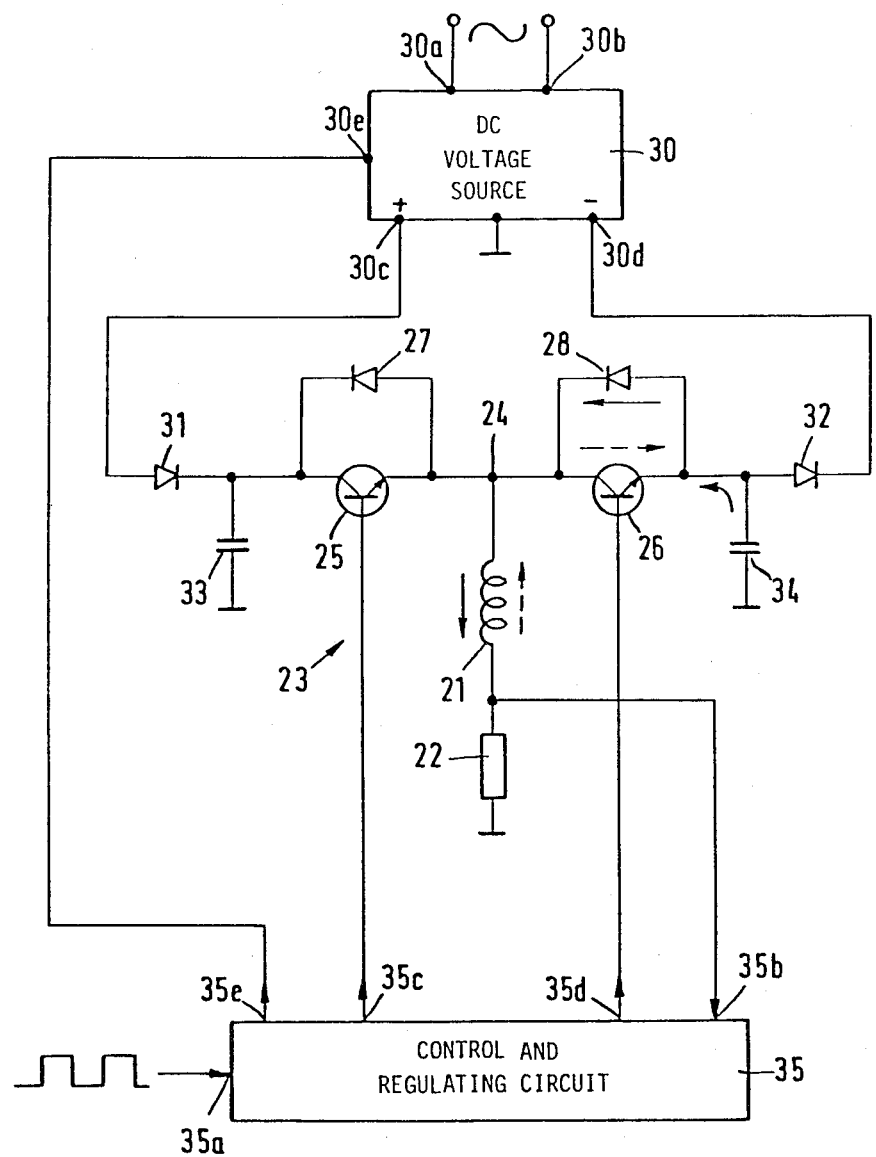
FIG. 4 shows the circuit diagram of a third embodiment of the invention.

In the embodiment of FIG. 4 the field coil 21 does not lie in the diagonal of a bridge circuit but in series with the current measuring resistance 22 in the cross branch of a T circuit 23 between the circuit point 24 and ground. In this case only two switching members are required which lie in the two longitudinal branches of the T circuit 23. It is assumed in FIG. 4 that the switching members are again formed as in the case of FIG. 3 by transistors 25, 26, a diode 27 and 28 respectively being connected in parallel oppositely poled with the collector-emitter circuit of each transistor.

This circuit requires that the mains network 30, which again receives at the input terminals 30a, 30b an AC voltage, furnishes at its output terminals 30c and 30d two DC voltages symmetrical with respect to ground. The output terminal 30c, which furnishes the voltage positive with respect to ground, is connected via a diode 31 to the collector of the transistor 25 whose emitter is connected to the circuit point 24. The output terminal 30d furnishing the negative voltage is connected via a diode 32 to the emitter of the transistor 26 whose collector is connected to the circuit point 24.

At the connection point between the diode 31 and the collector of the transistor 25 the one terminal of a capacitor 33 is connected and the other terminal of said capacitor 33 is applied to ground. Correspondingly, at the connection point between the diode 32 and the emitter of the transistor 26 the one terminal of a capacitor 34 is connected whose other terminal is applied to ground. Each of these two capacitors has a capacitance C which is dimensioned in the manner previously described in dependence upon the inductance L and the resistance R of the field coil 21 and the desired reversal time $\Delta t$.

The operating cycle of the circuit is controlled by a control and regulating circuit 35 which receives at its input 35a a clock signal defining the reversal rate. The input 35b receives the voltage drop at the current measuring resistance 22 which is a measure of the current flowing through the field coil 21. The base of the transistor 25 is connected to an output 35c and the base of the transistor 26 to an output 35d of the control and regulating circuit 35. Finally, an output 35e of the control and regulating circuit 35 furnishes a control signal to the voltage control input 30e of the mains network 30.

In the arrangement illustrated no special current regulating transistor is provided, the two transistors 25, 26 serving as switching members performing at the same time the function of current regulation. The control and regulating circuit 35 is thus so constructed that it furnishes at its outputs 35c, 35d control signals which in dependence upon the signal applied to the input 35b adjust the current flowing through the respective opened transistor 25 or 26 to the desired constant value.

This circuit operates in the following manner:

For the one value of the clock signal applied to the input 35a the control and regulating circuit 35b furnishes at the output 35c a signal which renders the transistor 25 conductive whilst simultaneously furnishing at the output 35d a signal which renders the transistor 26 non-conductive. Accordingly, a direct current flows from the output terminal 30c of the mains network 30 via the diode 31 and the opened transistor 25 to the circuit point 24 and from there via the field coil 21 and the current measuring resistance 22 to ground. The capacitor 33 is thereby charged substantially to the positive voltage of the terminal 30c apart from the voltage drop across the diode 31.

For the other value of the clock signal the transistor 25 is blocked and the transistor 26 opened so that now a current flows from ground via the current measuring resistance 22 and the field coil 21 to the circuit point 24 from whence it passes via the opened transistor 26 and the diode 32 to the terminal 30d of the mains network 30. The capacitor 34 is thereby substantially charged to the negative voltage of the terminal 30d apart from the voltage drop across the diode 32.

The reversal operation will now be considered immediately after blocking of the transistor 25 and opening of the transistor 26.

Prior to initiation of the reversal operation the current in the field coil 21 has the direction indicated by the arrow drawn in full line, i.e. from the circuit point 24 to ground. After blockage of the transistor 25 the field coil 21 at first maintains the current direction but this current must now be supplied by the capacitor 34. A current thus flows from the capacitor 34 via the diode 28 to the circuit point 24 as indicated by the arrows drawn in full lines. The negative terminal voltage of the capacitor 34 therefore increases in magnitude biasing the diode 32 in the reverse direction. When the current in the field coil 21 becomes zero the current direction reverses and a current then flows in the direction indicated by the dashed arrows from ground through the current measuring resistance 22 and the field coil 21 to the circuit point 24 and from there through the opened transistor 26 to the capacitor 34. As soon as the negative terminal voltage of the capacitor 34 becomes equal in magnitude to the voltage at the output terminal 30d of the mains network 30 the mains network again provides the current supply.

It is thus apparent that during the reversal operation the capacitor 34 is connected together with the field coil 21 to form a resonant circuit in which the same operations take place as previously described for the arrangement of FIGS. 1 and 2. This resonant circuit is separated during the reversal operation by the diode 32 from the mains network 30.

The reversal operation to the opposite switch condition is apparent immediately from the symmetry of the circuit. On blocking of the transistor 26 and opening of the transistor 25 the current initially continues to flow in the field coil 21 in the direction indicated by the dashed arrow. This current passes via the diode 27 to the capacitor 33, thus increasing the positive terminal voltage thereof so that the diode 31 is biased in the reverse direction. When the current passes through zero the direction thereof reverses so that a current flows from the capacitor 33 via the opened transistor 25 to the circuit point 24 and from there in the opposite direction through the field coil 21 and the current measuring resistance 22 to ground. As soon as the terminal voltage of the capacitor 33 has dropped to the voltage at the output terminal 30c the mains network again supplies the current. Thus, in this reversal operation the capacitor 33 is connected to the field coil 21 to form a resonant circuit.

In the embodiment illustrated in FIG. 4 as well the switching members may be formed by mechanical switches (e.g. relay contacts); however, in this case in each longitudinal branch of the T circuit an additional current regulating transistor must be provided.

Furthermore, in the circuit of FIG. 4 as well a further shortening of the reversal time can be achieved in that the output voltage of the mains network is temporarily increased during the reversal operation. It is done by the control signal supplied by the output 35e of the control and regulating circuit 35 to the control input 30e of the mains network 30.

The structure in circuit 11 is known. Thus, as shown in FIG. 1 of U.S. Pat. No. 3,733,538 to Kernick, et al., a box 16 labelled "Main Control Circuit" performs the identical function in controlling transistors 13A and 13B, as circuit 11 of the present application does in controlling transistors 13 to 16 (FIG. 3).

Figure 5:
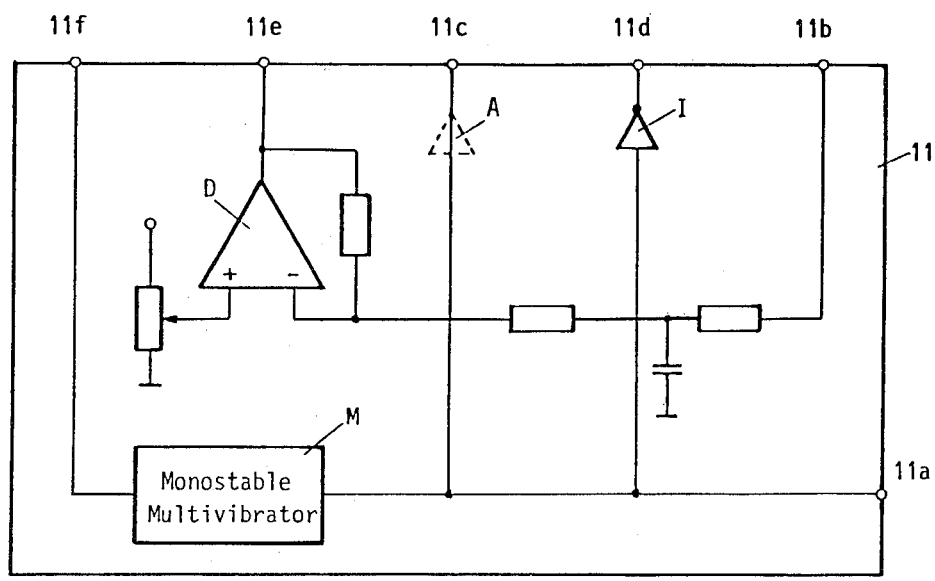
FIG. 5 shows the circuit diagram of the control and regulating circuit in FIG. 1.
Figure 6A:
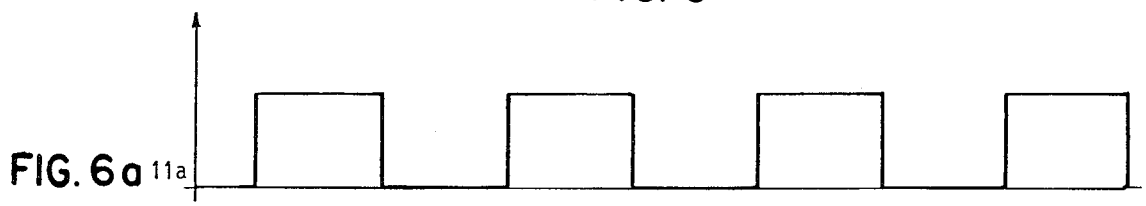
FIGS. 6a–6e show the timing diagrams of various points in FIG. 1.
Figure 6B:
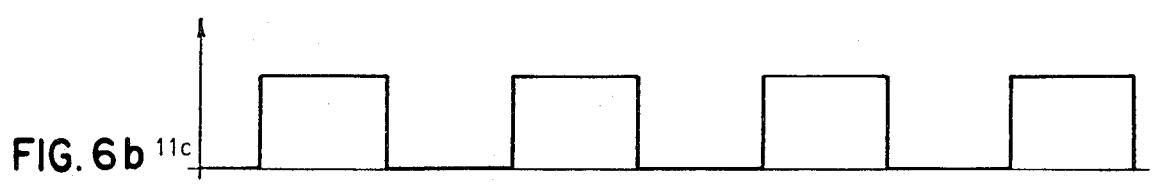
Figure 6C:
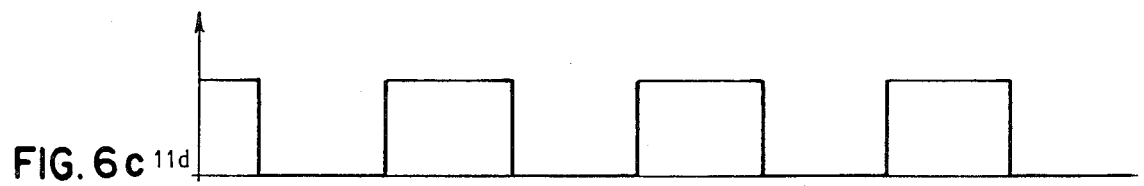
Figure 6D:
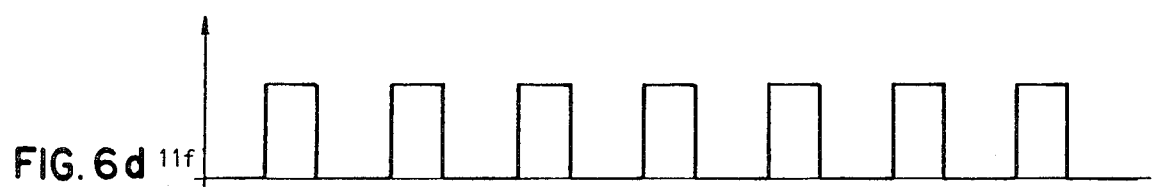
Figure 6E:
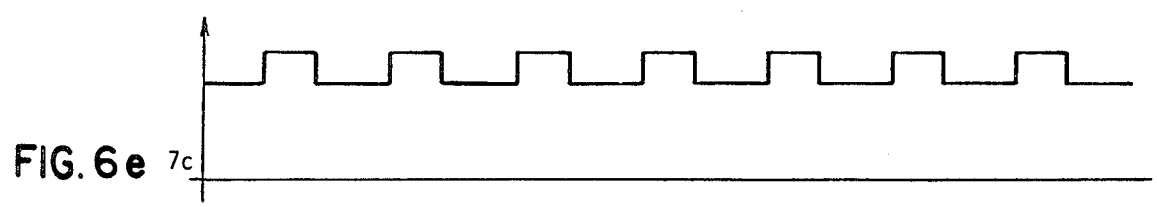

FIG. 5 shows the structure in circuit 11 and FIGS. 6a-6e show the time diagrams of the signals appearing at various terminals of the circuit arrangement shown in FIGS. 1, 2 and 3. The arrangement for the control of the switches 3 to 6 (transistors 13 to 16) is extremely simple: terminal 11c is directly connected to input terminal 11a, so that it carries a signal which is identical with the rectangular clock signal supplied to the input 11a; if necessary, an amplifier A may be inserted in this connection. Terminal 11d is connected to the output of an inverter stage I, the input of which receives the clock signal, so that the output signal at terminal 11d is 180° phase shifted with respect to the output signal at terminal 11c. Thus, it is respectfully urged this portion of circuit 11 could be readily determined by one of ordinary skill in this art without undue experimentation.

A conventional current regulating circuit is connected between terminals 11b and 11c. This circuit may comprise a differential amplifier D receiving at one input the voltage supplied to input 11b with suitable filtering and at the other input a reference voltage $V_{REF}$. The output of differential amplifier D controls the current regulating transistor 8. This arrangement is very similar to the current control circuit 20 shown in FIG. 4 of U.S. Pat. No. 3,733,538 and corresponds to the prior art technique mentioned in the section "Background of the Invention" in column 1, lines 10 to 21, of this patent.

Terminal 11f is connected to the output of a monostable multivibrator M which is triggered by each positive and negative going edge of the rectangular clock signal supplied to input 11a, so that it supplies a pulse at each switching operation. Each of these pulses supplied to the control input 7e of the power supply 7 temporarily increases the output voltage at terminal 7c. The duration of this voltage increase is determined by the output pulse width of the monostable multivibrator which is adjustable.

Instead of transistors other semiconductor circuit components may be used as switching members. If they are circuit members which can only transmit the current in one direction a diode of opposite polarity must be connected in parallel with each of them. These diodes may be separate circuit elements; in the case of transistors or thyristors which are formed with substrate diodes said substrate diodes can take on this function.

In all the embodiments illustrated a field-free phase may be inserted between the phases of oppositely poled magnetic field in that after the closure of the previously opened adjusting members the other adjusting members are opened only after a delay by the control and regulating circuit.

What we claim is:

1. An arrangement for generating DC magnetic fields of alternating polarity for the magnetic-inductive flow measurement by means of a field coil which is connected via alternately controlled switching members to a DC voltage source, wherein during the reversal time following the change-over of the switching members a capacitor is connected to the field coil to form a resonant circuit separate from the DC voltage source and the capacitance C of the capacitor in dependence upon the desired reversal time $\Delta t$ has substantially the value $$C = \frac{1}{L \cdot (\pi^2/\Delta t^2 + R^2/4L^2)} \text{ (Farads)}$$

wherein L is the inductance and R the ohmic resistance of the field coil.

2. An arrangement as defined in claim 1 wherein the field coil lies in the first diagonal of a bridge circuit to the second diagonal of which the DC voltage source is connected and in the four bridge branches of which switching members lie, the switching members lying in diametrically opposite bridge branches being rendered alternately conductive and non-conductive in pairs, and the capacitor is connected in parallel with the second bridge diagonal.

3. An arrangement as defined in claim 2 wherein between the connection point of the capacitor and the DC voltage source a switch member is inserted which blocks the connection during the reversal time.

4. An arrangement as defined in claim 3 wherein the switch member is a diode.

5. An arrangement as defined in any one of claims 2 to 4 wherein between the connection point of the capacitor and the DC voltage source a current regulator is inserted.

6. An arrangement as defined in claim 1 wherein each switching member is formed by a mechanical contact.

7. An arrangement as defined in claim 1 wherein each switching member is formed by a controllable electronic switch member.

8. An arrangement as defined in claim 7 wherein each electronic switch member is formed by a switch element conductive only in one direction and a diode connected oppositely poled parallel therewith.

9. An arrangement as defined in claim 8 wherein the controllable switch element is a transistor.

10. An arrangement as defined in claim 9 wherein the diode connected oppositely poled in parallel is a substrate diode.

11. An arrangement as defined in claim 8 wherein the controllable switch element is a thyristor.

12. An arrangement as defined in any one of claims 6 to 11 wherein the output voltage of the DC voltage source is increased during the reversal time.

13. An arrangement as defined in claim 1, comprising a DC voltage source having two output terminals supplying two output voltages of opposite polarity symmetrical with respect to the potential of a reference point, a first switching member connected between the first output terminal of said two output terminals and one terminal of said field coil, a second switching member connected between the second output terminal of said two output terminals and said one terminal of said field coil, the other terminal of said field coil being connected to said reference point, a first capacitor connected between said common reference point and the connection between said first switching member and said first output terminal, and a second capacitor connected between said common reference point and the connection between said second switching member and said second output terminal.

14. An arrangement as defined in claim 13, comprising a first switch member inserted between said first output terminal and the connection point of said first capacitor and a second switch member inserted between said second output terminal and the connection point of said second capacitor, each of said switch members blocking the connection during the reversal time.

15. An arrangement as defined in claim 14 wherein each switch member is a diode.

16. An arrangement as defined in claim 13 wherein in each connection between said one terminal of said field coil and the first and second output terminals of the DC voltage source a current regulator is inserted.

17. An arrangement as defined in claim 16 wherein each current regulator is formed by the corresponding switching member.

18. An arrangement as defined in claim 11 wherein the diode connected oppositely poled in parallel is a substrate diode.

* * * * *